(12) United States Patent  
Chiou et al.

(10) Patent No.: US 9,094,002 B2  
(45) Date of Patent: Jul. 28, 2015

(54) IN SITU PULSE-BASED DELAY VARIATION MONITOR PREDICTING TIMING ERROR CAUSED BY PROCESS AND ENVIRONMENTAL VARIATION

(71) Applicant: NATIONAL CHENG KUNG UNIVERSITY, Tainan (TW)

(72) Inventors: Lih-Yih Chiou, Tainan (TW); Chi-Ray Huang, Tainan (TW); Ming-Hung Wu, Tainan (TW)

(73) Assignee: National Cheng Kung University, Tainan (TW)

( * ) Notice: Subject to any disclaimer, the term of this patent is extended or adjusted under 35 U.S.C. 154(b) by 0 days.

(21) Appl. No.: 14/069,732

(22) Filed: Nov. 1, 2013

(65) Prior Publication Data

US 2014/0152344 A1 Jun. 5, 2014

(30) Foreign Application Priority Data

Dec. 4, 2012 (TW) .............................. 101145426 A

(51) Int. Cl.
*H03K 19/007* (2006.01)
*H03K 19/003* (2006.01)
*H03K 19/096* (2006.01)

(52) U.S. Cl.
CPC ...... *H03K 19/00369* (2013.01); *H03K 19/0963* (2013.01)

(58) Field of Classification Search
CPC ............... G06F 1/10; G06F 1/12; G06F 1/14; H03K 19/0963; H03K 5/135; H03L 7/00; H04L 1/0045; H04L 1/0057

USPC .......... 326/9–11, 93; 327/141, 144, 197–200; 713/400, 401; 714/746; 365/356, 365/189.05

See application file for complete search history.

(56) References Cited

U.S. PATENT DOCUMENTS

| | | | |
|---|---|---|---|
| 8,185,812 B2 | 5/2012 | Das et al. | |
| 8,339,166 B2* | 12/2012 | John et al. | 327/156 |
| 2004/0041591 A1* | 3/2004 | Forbes | 326/95 |
| 2007/0164787 A1* | 7/2007 | Grochowski et al. | 326/46 |
| 2009/0249175 A1* | 10/2009 | Chandra et al. | 714/822 |
| 2010/0164549 A1* | 7/2010 | Kuenemund et al. | 326/114 |
| 2011/0004813 A1 | 1/2011 | Chandra | |
| 2011/0302460 A1* | 12/2011 | Idgunji et al. | 714/55 |

FOREIGN PATENT DOCUMENTS

TW 201111944 A 4/2011

\* cited by examiner

*Primary Examiner* — Dylan White

(74) *Attorney, Agent, or Firm* — Rosenberg, Klein & Lee

(57) ABSTRACT

An in situ pulse-based delay variation monitor that predicts timing errors caused by process and environmental variations is revealed. The monitor includes a sequential storage device having a mater storage device and a slave storage device, a transition detector that is electrically connected to a node set on an electrical connection pathway from a master storage device to the slave storage device, and a warning signal generator electrically connected to the transition detector. The transition detector receives output of the master storage device to form a warning area by delay buffer, and generates a pulse width output correspondingly according to transition of the data input. Thus the warning signal generator generates a warning signal according to logic action at the pulse width and the clock input when the data input reaches the warning area. Thereby timing errors caused by static process variations and dynamic environmental variations are predicted.

11 Claims, 5 Drawing Sheets

IN SITU PULSE-BASED DELAY VARIATION MONITOR PREDICTING TIMING ERROR CAUSED BY PROCESS AND ENVIRONMENTAL VARIATION

BACKGROUND OF THE INVENTION

1. Fields of the Invention

The present invention relates to an in situ pulse-based delay variation monitor that predicts timing errors caused by process and environmental variations, especially to an in situ pulse-based delay variation monitor that predicts timing errors caused by a process and environmental variation in which a transition detector and pulse width are used to replace traditional error prediction flip flops. Traditionally, the in situ error prediction circuit senses the timing error by comparing the data between the main flip flop and the canary flip flop among a user defined prediction window. However, in the present invention, a pulse detector technique is adopted to predict the timing error instead of the canary flip flop for power reductions and area savings. Moreover, the function of error detection is also added. Thus users still know whether the correct data is captured or not even the clock signal is over the checking time. And the circuit is used as a performance monitor for components that support the adaptive voltage scaling. The components can be processors, microprocessors, central processing unit (CPU), digital signal processor (DSP), etc.

2. Descriptions of Related Art

With scaling of advanced process technology, variations in process, voltage and temperature (PVT) that could cause timing errors during operation of microprocessors are increasingly significant. Traditionally, IC designers consider the worst case conditions and use a large safety margin to increase the tolerance of process, voltage and temperature variations. The system designed under such a pessimistic assumption may consume unnecessary power consumption and occupy extra area simultaneously. Therefore, adaptive designs, such as adaptive voltage scaling or adaptive frequency scaling, becomes an indispensable technique for eliminating large safety margins. According to the results of the PVT variation detectors, the unacceptable energy and performance loss can be mitigated by adaptively controlling the supply voltage or operating frequency.

Especially an IC design with ultra-low supply voltages, process variations leads to quite large variations in circuit operation time. For normal operation considering all the variations, the circuit runs based on the worst-case voltage to ensure all the functions are executed correctly. However, this causes a lower energy efficiency of the circuit. Thus the solution is to adjust the operating voltage dynamically by a mechanism that can detect process variations and avoid operating at the worst case under all conditions.

Generally in situ detection mechanism is divided into two groups according to retrieving form of wrong timing data. One is error detection mechanism. After the data being retrieved, whether there are errors in the retrieved data caused by timing errors can be checked. For example, referring to U.S. Pat. No. 8,185,812, a single event upset error detection within an integrated circuit is revealed. It uses a technique referred to "Razor" that allows voltage safety margins providing for uncertainties in silicon and ambient conditions to be eliminated or reduced. In general, the Razor technique involves adjustment of the operating parameters of an integrated circuit, such as the clock frequency, the operating voltage, the body bias voltage, temperature and the like so as to maintain a finite non-zero error rate in a manner that increases overall performance. Errors are detected in the processing stages by comparing a non-delayed data value with a delayed data value. The single event upset error detection within an integrated circuit includes a plurality of steps. Store a sampled input signal within a sequential storage element. Then detect a transition of the single stored signal value stored by the sequential storage element occurring at a time outside a valid transition period as indicating an error by combinatorial logic. However, the shortcoming of the above method is in that errors can only be detected after the errors occurred and a period of time for recovery is required after detection of the errors. Thus once the errors occurred, the power overhead is significant.

The other in situ detection mechanism is error prediction mechanism, which focuses on whether the timing errors possibly occur can be predicted in advance before errors actually occur. Generally, the error prediction mechanism including a main flip-flop and a canary is applied only to compare input signals within a checking period preset by designers. Moreover, the error prediction circuit still has prediction errors in its existed concept of design. If the timing signal is over the checking period preset by designers, whether the correct data is captured or not is unable to be learned.

SUMMARY OF THE INVENTION

Therefore it is a primary object of the present invention to provide an in situ pulse-based delay variation monitor that predicts timing errors caused by process and environmental variations in which a transition detector and pulse width are used to replace conventional error-prediction flip-flop so as to predict timing errors. Moreover, the monitor also provides error detection function. Even the timing signal is over a preset checking time, users can still learn whether the correct data is captured or not. Thus this circuit technique can be applied to processors that support adaptive voltage scaling.

In order to achieve the above objects, an in situ pulse-based delay variation monitor that predicts timing errors caused by process and environmental variations of the present invention is applied to in situ pulse timing circuit that support adaptive voltage scaling. The monitor includes a sequential storage device, a transition detector, and a warning signal generator. The sequential storage device includes a master storage device receiving a clock input and a slave storage device. The master storage device has a data input while the slave storage device has a data output. A node is arranged at an electrical connection pathway from the master storage device to the slave storage device. The transition detector is electrically connected to the node to receive output of the master storage device, form a warning area by delay buffer, and generates a pulse width output correspondingly according to transition of the data input. As to the warning signal generator, it is electrically connected to the transition detector and generating a warning signal according to logic action at the pulse width and the clock input when the data input reaches the warning area.

The transition detector further includes a delay unit electrically connected to the node for forming the warning area and a pulse width generating unit electrically connected to the node and the delay unit. The delay unit has at least one buffer. When the delay unit includes at least two buffers, these buffers are connected to a multiplexer. Thus the delay unit can adjust the width of the warning area. The pulse width generating unit receives output of the warning area and data transmitted from the master storage device so as to output the pulse width. A preferred pulse width generating unit is an exclusive OR (XOR) gate.

The warning signal generator includes a first dynamic AND gate and a first inverter for receiving output of the first dynamic AND gate. The first dynamic AND gate can be a domino logic circuit.

The sequential storage device can be a latch or a flip-flop.

The master storage device starts transmitting data when the clock input is on the negative edge while the delay unit increases pulse width by delay buffer of the data from the master storage device. The pulse width is the warning area. Then the pulse width generating unit outputs the pulse width correspondingly according to the transition of the data input. When the data input arrives the warning area, the warning signal is generated by logic action of the first dynamic AND gate at the pulse width and the positive clock so as to predict timing errors caused by static process variations and dynamic environmental variations. Compared with traditional error-prediction flip-flop, the present invention has less overhead in many aspects such as area, clock load, power consumption, and delay from clock to output data Moreover, in another circuit design of the monitor, it further includes a clock gating controller that receives the clock input and the pulse width respectively, and a latch that receives output of the clock gating controller and the data input. The clock gating controller performs clock gate control of the clock input by the pulse width to extend access time of the latch. Moreover, output of the master storage device and output of the latch are compared by logic action to generate an error signal. Thereby the circuit of the monitor of the present invention generates warning signals and error signals to provide error prediction and error detection functions at the same time. Thus users can still learn whether the correct data is captured or not even the clock signal is over the checking time. Therefore the problem of conventional circuit for prediction that is unable to detect errors after specific timing delay is solved.

Due to the fact that the present invention further includes dynamic error detection function (output error signals) besides the error prediction mechanism (output warning signals). The present invention is not only suitable for processors that support adaptive voltage scaling and used as a checking criteria for adaptive voltage scaling but also has higher flexibility in dynamic voltage scaling due to prediction and detection mechanisms. In addition, the present invention helps IC designers to design monitors that predict timing errors caused by process and environmental variations such as central processing unit, microcontroller, etc. Thus the monitor not only works at optimal voltage and frequency but also achieve better energy efficiency

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE PREFERRED EMBODIMENT

Figure 1:
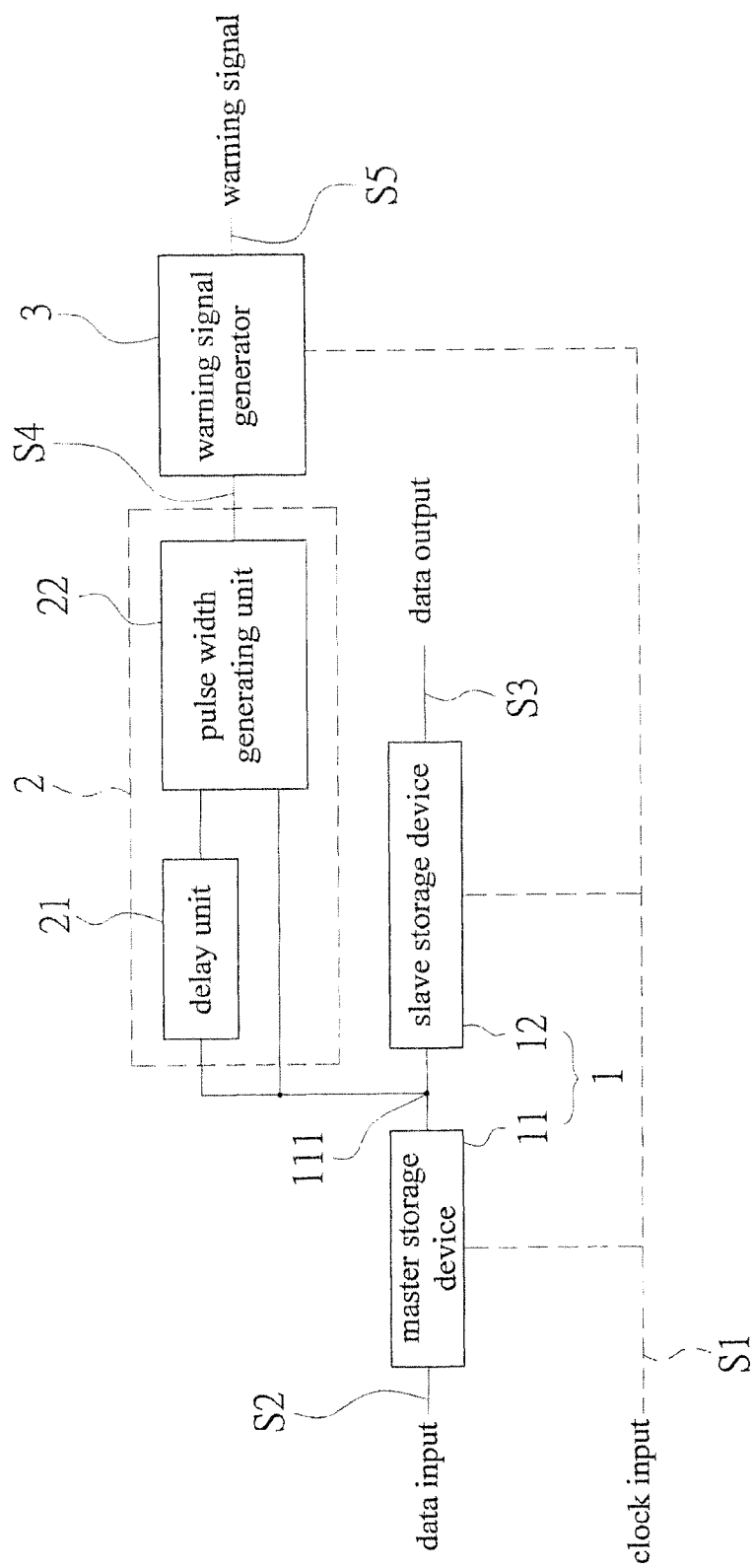
FIG. 1 is a block diagram showing electrical connection of a monitor according to the present invention.
Figure 3:
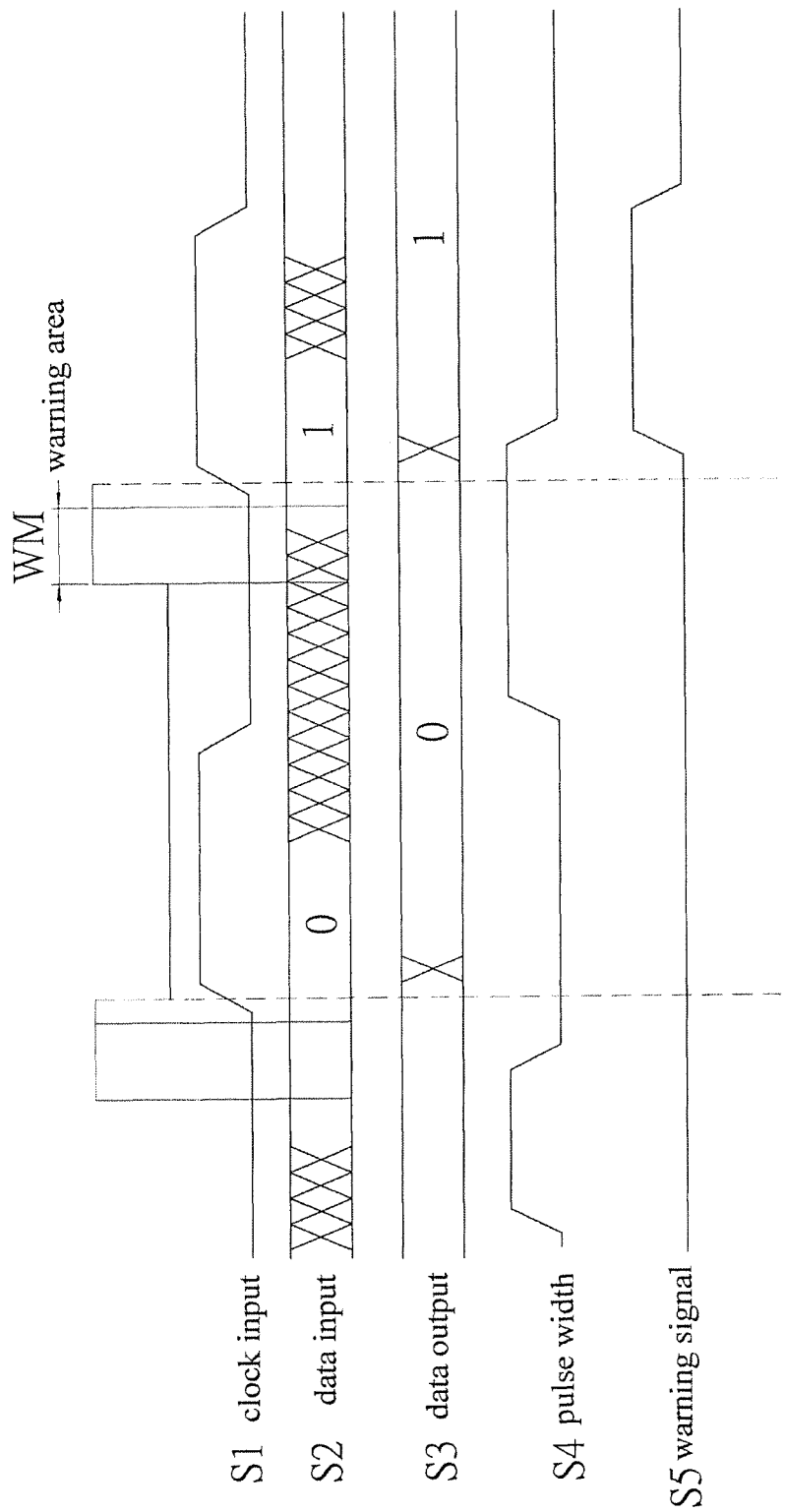
FIG. 3 is a schematic drawing showing error prediction timing of an embodiment according to the present invention.

Referring to FIG. 1 and FIG. 3, a block diagram showing electrical connections of an embodiment of the present invention and a schematic drawing showing timing error prediction are revealed. An in situ pulse-based delay variation monitor-based delay variation monitor that predicts timing error includes a sequential storage device 1, a transition detector 2, and a warning signal generator 3.

The sequential storage device 1 consists of a master storage device 11 receiving a clock input S1 and a slave storage device 12. The master storage device 11 has a data input S2 while the slave storage device 12 has a data output S3. A node 111 is set on an electrical connection pathway from the master storage device 11 to the slave storage device 12. The sequential storage device 1 can be a flip-flop.

The transition detector 2 is electrically connected to the node 111 to receive output of the master storage device 11, form a warning area WM (as shown in FIG. 3) by delay buffer, and generate a pulse width S4 output correspondingly according to transition of the data input S2.

The warning signal generator 3 is electrically connected to the transition detector 2. When the data input S2 arrives the warning area WM, the warning signal generator 3 acts according to logic action at the pulse width S4 and the clock input S1 for producing a warning signal S5. Clock gating is a common technique used in digital circuit design for reducing power consumption. It's based on that a clock signal is divided into a plurality of independent signals for control of unused functional blocks in chips respectively. Thus operation units unused may be temporarily gated to avoid unnecessary power consumption. That means the clock signal is converted into a fixed logic level (1 or 0). Take a clock signal in the form of a square as an example, it is switched between a logic level "1" at high voltage and the other logic level "0" at low voltage. In order to gate the clock signal, the clock signal is converted to a constant logic level "1" or the logic level "0". If the logic operation circuit provides a clock signal with a fixed logic level, the operation unit stops working. Thus overall power consumption of the logic operation circuit is further reduced.

Figure 2:
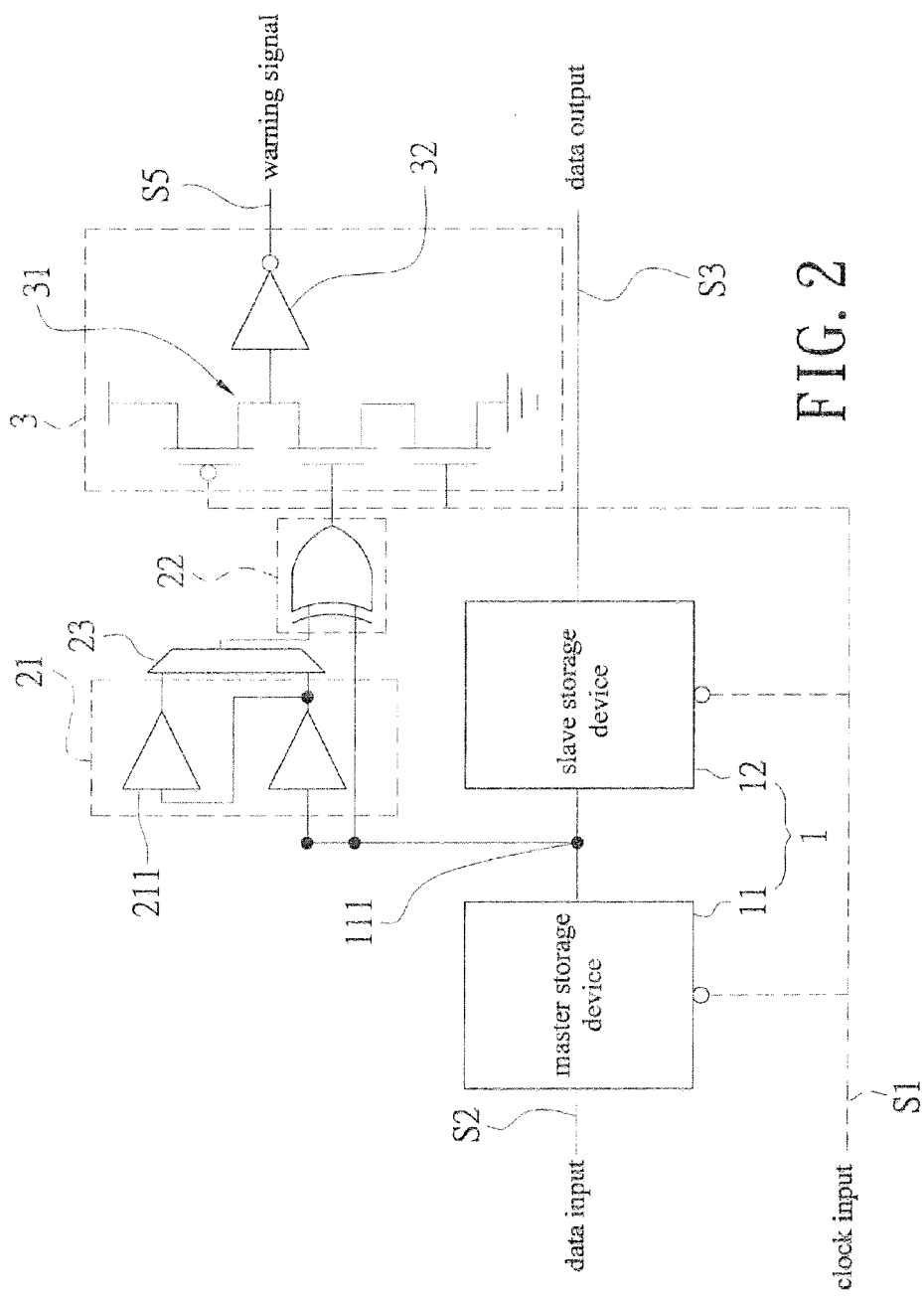
FIG. 2 is a circuit diagram of an embodiment that generates warning signals and provides an error prediction function.

Referring to FIG. 2, a circuit diagram of an embodiment that generates a warning signal and provides an error prediction function according to the present invention is revealed. The transition detector 2 consists of a delay unit 21 electrically connected to the node 111 for forming the warning area WM, a pulse width generating unit 22 electrically connected to the node 111 and the delay unit 21, and a multiplexer 23. The pulse width generating unit 22 respectively receives output of the warning area WM and data transmitted from the master storage device 11 so as to output the pulse width S4. The delay unit 21 includes at least one buffer 211. In this embodiment, there are two buffers 211 connected in series while the two buffers 211 are connected to the multiplexer 23. Thus the delay unit 21 can adjust the width of the warning area WM. The pulse width generating unit 22 is an exclusive OR (XOR) gate 6.

In this embodiment, the warning signal generator 3 includes a first dynamic AND gate 31 and a first inverter 32 that receives output of the first dynamic AND gate 31. The first dynamic AND gate 31 can be a domino logic circuit.

While in use, referring to FIG. 3, the circuit works based on that the master storage device 11 starts transmitting data when the clock input S1 is on the negative edge while the delay unit 21 receives the data from the master storage device 11 and increases pulse width by delay buffer. The pulse width is the warning area WM. Then the pulse width generating unit 22 outputs the pulse width S4 correspondingly according to the transition of the data input S2. When the data input S2 arrives the warning area WM, the warning signal S5 is generated by a logic action of the first dynamic AND gate 31 of the warning signal generator 3 at the pulse width S4 and positive clock. On the other hand, once the data input S2 hasn't reached the warning area WM, the pulse width S4 has no effects on the warning signal S5 because the output node of the first dynamic AND gate 31 is not discharged. When the clock input S1 is on the positive edge, the master storage device 11 cuts off the input transition so that the transition power consumption caused by the delay unit 21 is reduced.

Figure 4:
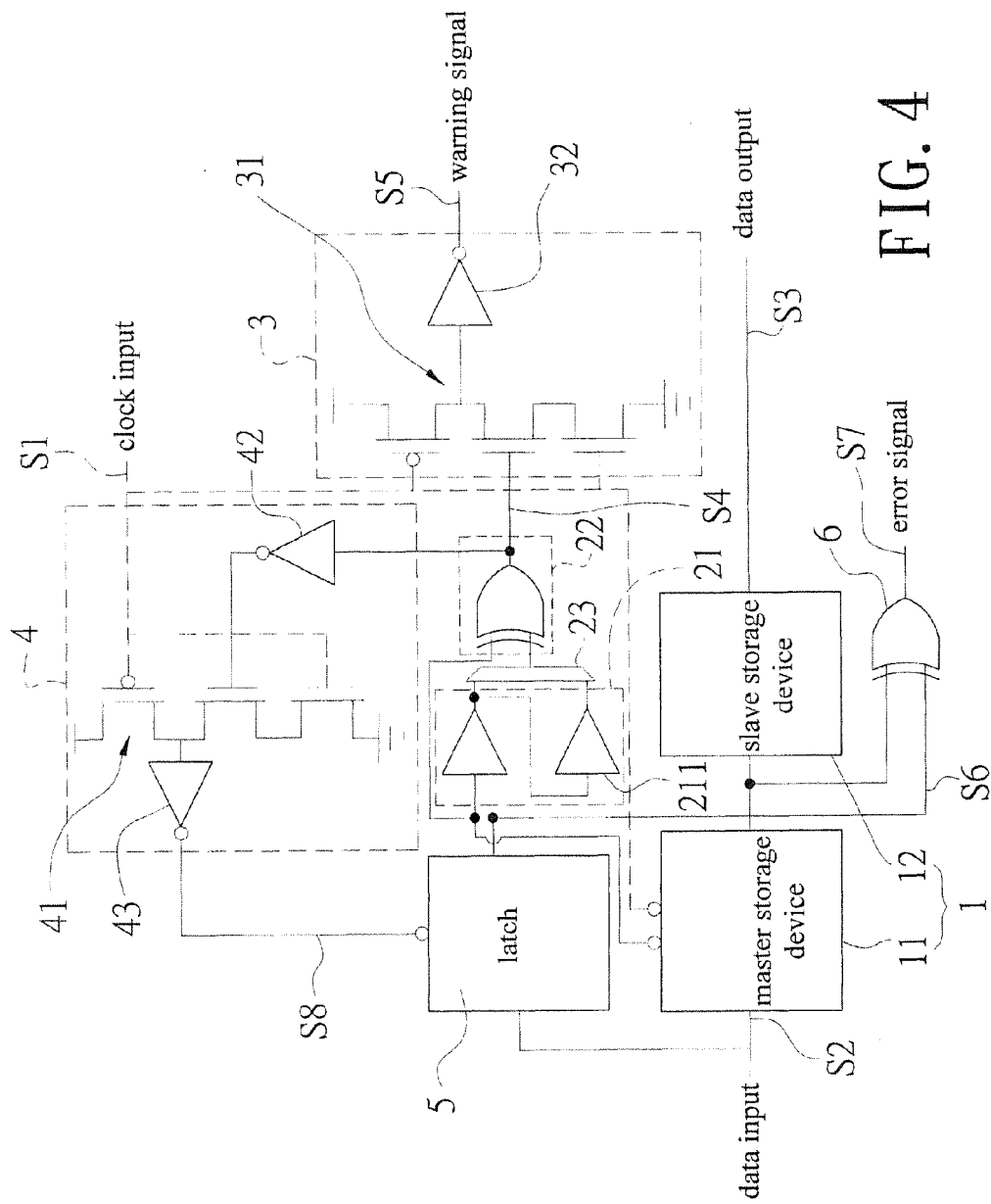
FIG. 4 is another embodiment that generates warning signals and error signals for providing error prediction and error detection simultaneously according to the present invention.

Referring to FIG. 4, a circuit diagram of another embodiment that generates warning signals and error signals and has functions of both error prediction and error detection according to the present invention is disclosed. The monitor further includes a clock gating controller 4 that receives the clock input S1 and the pulse width S4 respectively and a latch 5 that receives output of the clock gating controller 4 and the data input S2. The clock gating controller 4 performs clock gate control of the clock input S1 by the pulse width S4 and also outputs a gate control clock S8 for extending access time of the latch 5. Moreover, output of the master storage device 11 and output of the latch 5 are compared by logic action to generate an error signal S7. Thereby capability of dynamic error detection is added into the error prediction mechanism so that users can still learn whether the correct data is captured or not even the timing signal is over the checking time. Thus the problem of conventional circuit unable to detect errors occurred after specific timing delay can be solved.

Figure 5:
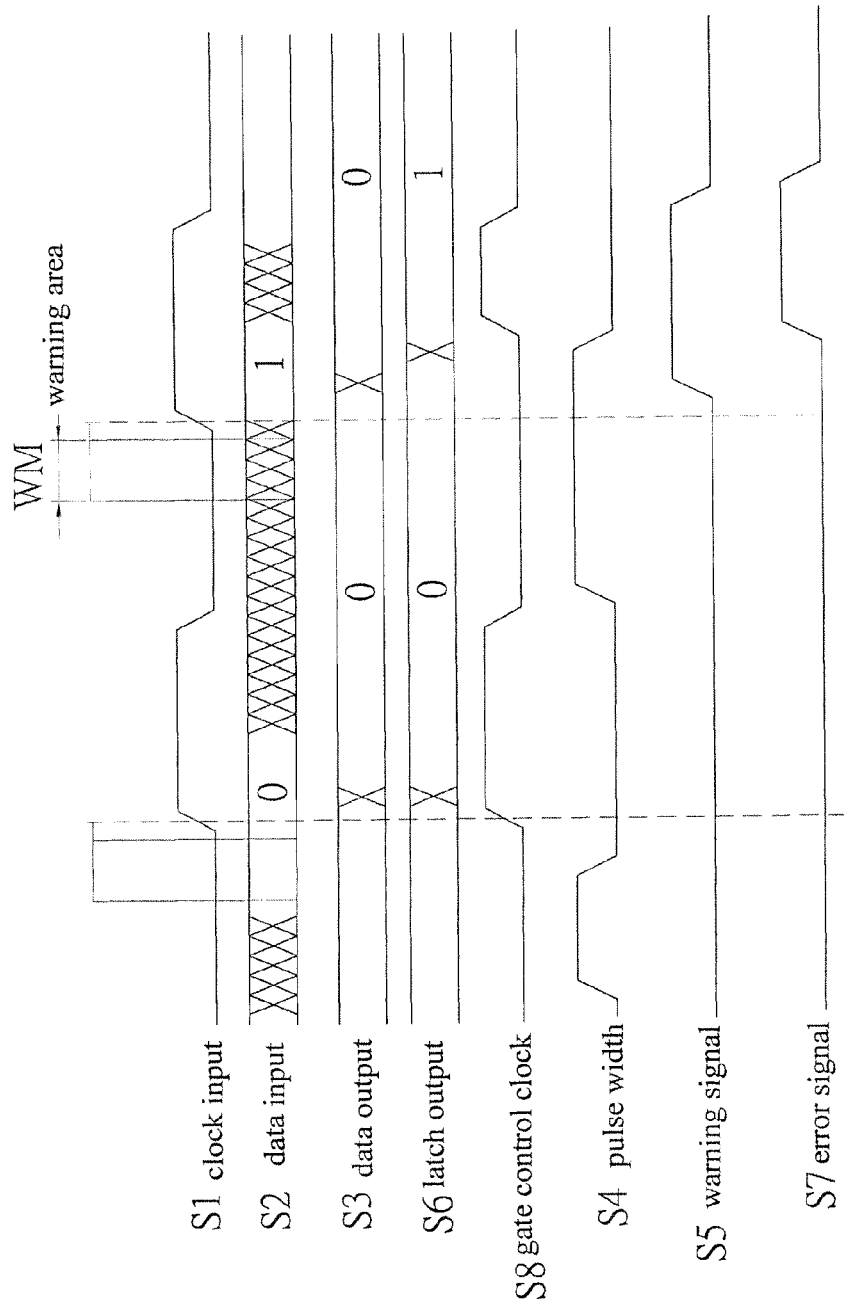
FIG. 5 is a schematic drawing showing timing of error prediction and error detection of an embodiment according to the present invention.

In the above logic action, an exclusive OR (XOR) gate 6 is used to receive output of the master storage device 11 and output of the latch 5. Moreover, the clock gating controller 4 consists of a second dynamic AND gate 41 that receives the clock input S1, a second inverter 42 that receives the pulse width S4 and outputs to the second dynamic AND gate 41, and a third inverter 43 that receives the output of the second dynamic AND gate 41 and outputs to the latch 5. Also referring to FIG. 5, a schematic drawing showing error prediction and detection timing of an embodiment according to the present invention is revealed. The circuit works based on that when the clock is on the negative edge, the pulse width generating unit 22 performs a corresponding output of the pulse width S4 in response to the transition of the data input S2 if the transition time of the data input S2 is too long. Then a logic action of the dynamic AND gate at the positive edge and the pulse width S4 is performed through the second inverter 42. Thus clock gating is completed. Thereby the access time of the latch 5 is extended and correct data is further obtained. Next a logic action of the XOR gate 6 operates at the output of the master storage device 11 and data of latch output S6 is performed to set up a signal line of error detection. On the other hand, when the transition time of the data input S2 is within access limit of the sequential storage device 1, the pulse width S4 will not affect the clock gating because the second dynamic AND gate 41 executes the charging operation and the clock generated is the same as the original clock. If the clock is on the positive edge, there is no pulse width S4 generated. Thus the second dynamic AND gate 41 performs discharging operation and the clock generated is the same as the original clock.

In summary, the present invention has the following advantages:

1. The present invention generates pulse width by the transition detector that detects data transition in the master storage device and generates a warning signal by the warning signal generator so as to predict timing errors caused by static process and dynamic environmental variations. Compared with traditional error-prediction flip-flop, the present invention has less overhead in many aspects such as area, clock load, power consumption, and delay from clock to output data.
2. The present invention adds dynamic error detection (output error signals) function into the error prediction mechanism (output warning signals). Thus users can still learn whether the correct data is captured or not even the clock signal is over the checking time. Therefore better error prediction is achieved and the problem of conventional circuit for prediction that is unable to detect errors after specific timing delay is also solved.
3. The in situ pulse-based delay variation monitor that predicts timing error caused by process and environmental variations of the present invention is not only suitable for processors that support adaptive voltage scaling techniques but also has higher flexibility in dynamic voltage scaling due to prediction and detection mechanisms. Thus the present invention helps IC designers to design circuit of monitors that predict timing errors caused by process and environmental variations such as central processing unit, microcontroller, etc. Thus the monitor not only works at proper voltage and frequency but also achieve optimal energy efficiency.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. An in situ pulse-based delay variation monitor that predicts timing errors caused by process and environmental variations, comprising:
    a sequential storage device having a master storage device receiving a clock input and a slave storage device; the master storage device having a data input and the slave storage device having a data output;
    a node being established on an electrical connection from the master storage device to the slave storage device;
    a transition detector being electrically connected to the node for receiving the data output of the master storage device to define a warning area having a predetermined time span defined by a delay buffer, said transition detector generating a pulse width output responsive to transition of the data input; and
    a warning signal generator being electrically connected to the transition detector; wherein the warning signal generator produces a warning signal responsive to the pulse width and the clock input when the data input is detected in the predetermined time span defined by the warning area.

2. The device as claimed in claim 1, wherein the transition detector includes a delay unit electrically connected to the node for forming the warning area and a pulse width generating unit electrically connected to the node and the delay unit respectively; the pulse width generating unit receives output of the warning area and data transmitted from the master storage device so as to output the pulse width.

3. The device as claimed in claim 2, wherein the delay unit includes at least one buffer.

4. The device as claimed in claim 3, wherein the delay unit includes at least two buffers; each of two buffers is connected to a multiplexer so that the delay unit is able to adjust width of the warning area.

5. The device as claimed in claim 2, wherein the pulse width generating unit is an exclusive OR (XOR) gate.

6. The device as claimed in claim 1, wherein the warning signal generator includes a first dynamic AND gate and a first inverter for receiving output of the first dynamic AND gate.

7. The device as claimed in claim 6, wherein the first dynamic AND gate is a domino logic circuit.

8. The device as claimed in claim 1, wherein the sequential storage device is a latch or a flip-flop.

9. The device as claimed in claim 1, further includes a clock gating controller for respectively receiving the clock input and the pulse width, and a latch for receiving output of the clock gating controller and the data input; the clock gating controller performs clock gate control of the clock input by the pulse width to extend access time of the latch and output of the master storage device and output of the latch are compared by a logic action to generate an error signal.

10. The device as claimed in claim 9, wherein the clock gating controller includes a second dynamic AND gate that receives the clock input, a second inverter that receives the pulse width and outputs to the second dynamic AND gate, and a third inverter that receives output of the second dynamic AND gate and outputs to the latch.

11. The device as claimed in claim 9, wherein in the logic action, an exclusive OR (XOR) gate is used to receive output of the master storage device and output of the latch.

* * * * *